US009444424B2

(12) United States Patent
Mizoguchi

(10) Patent No.: US 9,444,424 B2
(45) Date of Patent: Sep. 13, 2016

(54) POLAR-TYPE LOW PASS FILTER AND DEMULTIPLEXER EQUIPPED THEREWITH

(71) Applicant: Murata Manufacturing Co., Ltd., Nagaokakyo-shi, Kyoto-fu (JP)

(72) Inventor: Naoki Mizoguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 102 days.

(21) Appl. No.: 14/149,843

(22) Filed: Jan. 8, 2014

(65) Prior Publication Data

US 2014/0232481 A1   Aug. 21, 2014

(30) Foreign Application Priority Data

Feb. 15, 2013   (JP) .................. 2013-027460
Sep. 27, 2013   (JP) .................. 2013-202216

(51) Int. Cl.
*H03H 7/46*   (2006.01)
*H03H 7/01*   (2006.01)

(52) U.S. Cl.
CPC ............. *H03H 7/0138* (2013.01); *H03H 7/46* (2013.01); *H03H 7/463* (2013.01)

(58) Field of Classification Search
CPC ...... H03H 7/0138; H03H 7/463; H03H 7/46; H03H 7/0115
USPC .......................... 333/132, 126–129, 134, 136
See application file for complete search history.

(56) References Cited

U.S. PATENT DOCUMENTS 5,726,612 A     3/1998  Mandai et al.
6,154,112 A *  11/2000  Aoba et al. ................... 336/192
6,737,935 B1 *  5/2004  Shafer ........................... 333/132
2004/0116098 A1  6/2004  Ochii et al.
2012/0319801 A1* 12/2012  Taniguchi .................... 333/185
2013/0009726 A1  1/2013  Sasaki

FOREIGN PATENT DOCUMENTS

| JP | 64-36112 A | 2/1989 |
|---|---|---|
| JP | 05-199008 A | 8/1993 |
| JP | 05-243815 A | 9/1993 |
| JP | 06-037510 A | 2/1994 |
| JP | 06-176927 A | 6/1994 |
| JP | 11-355008 A | 12/1999 |
| JP | 2004-120716 A | 4/2004 |
| JP | 2004-194240 A | 7/2004 |
| JP | 2006-184773 A | 7/2006 |
| JP | 2006-279604 A | 10/2006 |
| JP | 2010-232765 A | 10/2010 |
| JP | 2010-269215 A | 12/2010 |
| JP | 2013-21449 A | 1/2013 |

OTHER PUBLICATIONS

Official Communication issued in corresponding Japanese Patent Application No. 2013-202216, mailed on Feb. 2, 2016.

* cited by examiner

*Primary Examiner* — Robert Pascal
*Assistant Examiner* — Kimberly Glenn
(74) *Attorney, Agent, or Firm* — Keating & Bennett, LLP

(57) ABSTRACT

A polar-type low pass filter includes a low pass filter portion and first, second and third ground conductors, in a laminated body. The low pass filter portion includes parallel resonant circuits including first, second, third and fourth capacitors and inductors, in a series arm, and at least capacitors in a parallel arm thereof. Pattern conductors configuring the first, second, third and fourth capacitors face the first ground conductor and so forth, in a z-axis direction.

16 Claims, 16 Drawing Sheets

POLAR-TYPE LOW PASS FILTER AND DEMULTIPLEXER EQUIPPED THEREWITH

BACKGROUND OF THE INVENTION

1. Field of the Invention

The present invention relates to a low pass filter having an attenuation pole in a vicinity of a pass band, and a demultiplexer equipped therewith.

2. Description of the Related Art

In the past, as this type of low pass filter (hereinafter, referred to as a low pass filter (LPF) in some cases), for example, there has been a low pass filter described in Japanese Unexamined Patent Application Publication No. 2010-232765. This LPF includes a series arm, and, for example, three parallel arms. In this series arm, for example, two parallel resonant circuits are provided. A first parallel arm is provided between the input terminal of the LPF and a parallel resonant circuit located at a previous stage. In addition, a second parallel arm is provided between the two parallel resonant circuits. A third parallel arm is provided between a parallel resonant circuit located at a subsequent stage and the output terminal of the LPF. One capacitor is provided in each parallel arm.

In general, in accordance with requested specifications, the pass band, the frequency position of an attenuation pole, the size, and the like of an LPF are defined. However, when the LPF is miniaturized, in some cases it is difficult to mount a sufficient number of inductor elements or capacitor elements, and as a result, there has been a problem that it has been difficult to provide an attenuation pole in a desired frequency position.

SUMMARY OF THE INVENTION

Accordingly, preferred embodiments of the present invention provide a low pass filter capable of providing an attenuation pole in a desired frequency position, and a demultiplexer equipped therewith.

According to a preferred embodiment of the present invention, a polar-type low pass filter includes a laminated body in which a plurality of base material layers are laminated, an input terminal, an output terminal, and a ground terminal provided on or in a surface of the laminated body, and at least one ground conductor provided within the laminated body, wherein a series arm connecting the input terminal and the output terminal includes a parallel resonant circuit including a capacitor and an inductor, a parallel arm connecting the series arm and the ground terminal includes at least a capacitor, at least the capacitor included in the parallel resonant circuit includes a plurality of pattern conductors provided within the laminated body, and the at least one ground conductor and at least one of the plural pattern conductors face each other in a lamination direction of the base material layers.

In addition, according to a preferred embodiment of the present invention, a demultiplexer includes a laminated body in which a plurality of base material layers are laminated, an input terminal, an output terminal, and a ground terminal provided on a surface of the laminated body, at least one ground conductor provided within the laminated body, a high pass filter provided within or on the laminated body and including a capacitor and an inductor, and a polar-type low pass filter provided within or on the laminated body, wherein, in the polar-type low pass filter, a series arm connecting the input terminal and the output terminal includes a parallel resonant circuit including a capacitor and an inductor, and a parallel arm connecting the series arm and the ground terminal includes at least a capacitor, at least the capacitor included in the parallel resonant circuit includes a plurality of pattern conductors provided within the laminated body, and the at least one ground conductor and at least one of the plural pattern conductors face each other in a lamination direction of the base material layers.

According to various preferred embodiments of the present invention, it is possible to provide a polar-type low pass filter capable of providing an attenuation pole in a desired frequency position, and a demultiplexer equipped therewith.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
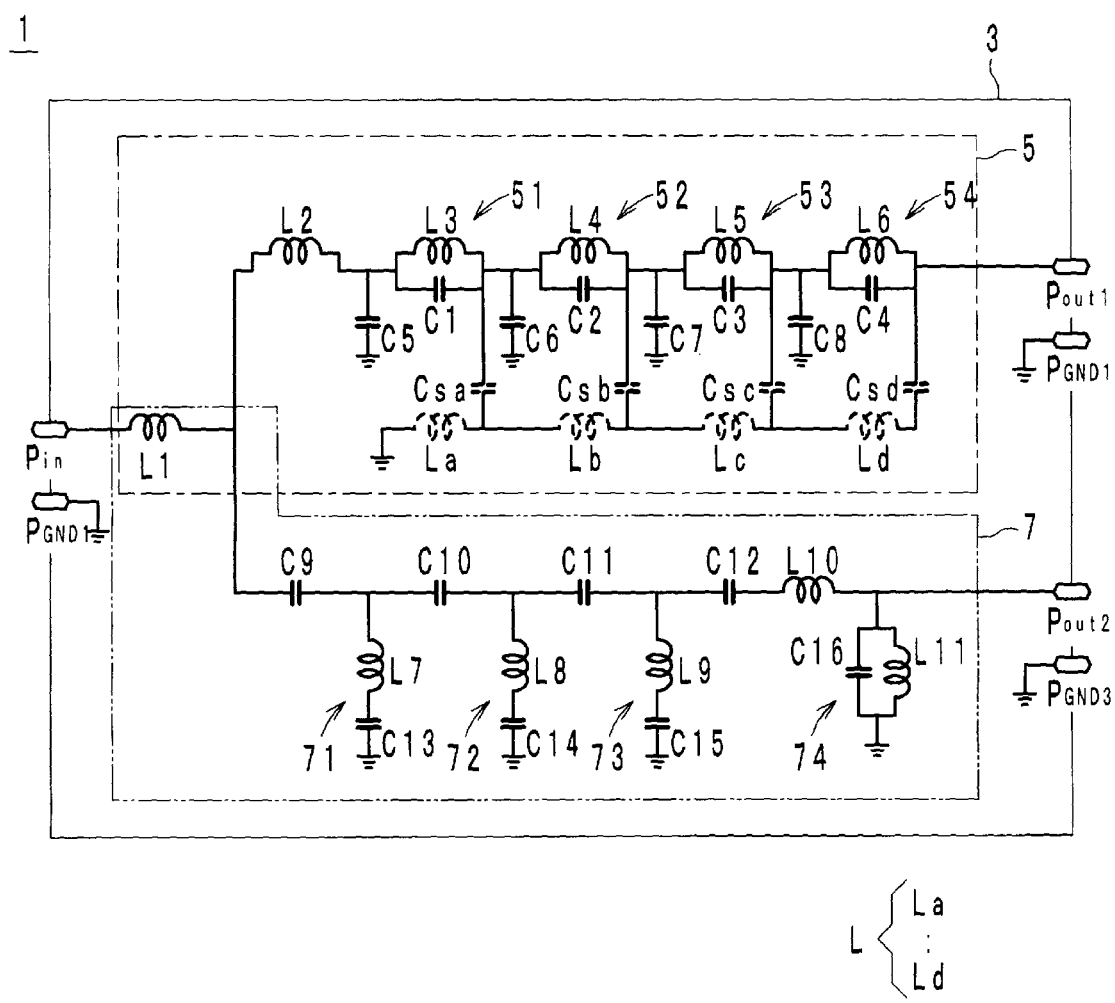
FIG. 1 is an equivalent circuit diagram of a demultiplexer according to a preferred embodiment of the present invention.

Hereinafter, with reference to FIG. 1 to FIG. 7B, a polar-type low pass filter according to a preferred embodiment and a demultiplexer equipped therewith will be described in detail.

First, in FIG. 1, a demultiplexer 1 includes a common input terminal $P_{in}$, a polar-type low pass filter (hereinafter, referred to as an LPF in some cases) 5, a high pass filter (hereinafter, referred to as an HPF in some cases) 7, a first output terminal $P_{out1}$, a second output terminal $P_{out2}$, and a plurality of ground terminals $P_{GND1}$ to $P_{GND4}$.

Between the common input terminal $P_{in}$ and one of the plural ground terminals $P_{GND1}$ to $P_{GND4}$, a frequency-multiplexed signal to be demultiplexed in the demultiplexer 1 is input. In this frequency-multiplexed signal, for example, a signal of about 65 MHz band and a signal of about 87 MHz band, used for a cable TV, preferably are multiplexed.

In a series arm connecting the common input terminal $P_{in}$ and the output terminal $P_{out1}$, the LPF 5 includes inductors L1 and L2 and a plurality of parallel resonant circuits 51 to 54, so as to cause the signal of about 65 MHz band, included in the input frequency-multiplexed signal, to pass therethrough. The parallel resonant circuit 51 includes an inductor L3 and a capacitor C1, connected in parallel. In the same way, the parallel resonant circuits 52 to 54 include inductors L4 to L6 and capacitors C2 to C4, connected in parallel.

The LPF 5 further includes capacitors C5 to C8. The capacitor C5 is provided in a parallel arm connecting a ground and a portion between the inductor L2 and the parallel resonant circuit 51. The capacitor C6 is provided in a parallel arm connecting the ground and a portion between the parallel resonant circuits 51 and 52, the capacitor C7 is provided in a parallel arm connecting the ground and a portion between the parallel resonant circuits 52 and 53, and the capacitor C8 is provided in a parallel arm connecting the ground and a portion between the parallel resonant circuits 53 and 54.

In addition, while described in detail later, the LPF 5 includes ground conductors G1 to G3 (refer to FIG. 4C and FIG. 4D) provided in a laminated body 3. Stray capacitances Csa to Csd occurring between pattern conductors configuring the capacitors C1 to C4 and the ground conductor G1 and inductance components La to Ld occurring in the ground conductors G1 to G3 are illustrated by dotted lines in FIG. 1.

The pass band characteristic of the LPF 5 and the frequency position and the attenuation of an attenuation pole in a vicinity of a pass band are roughly defined by the values of the inductors L1 to L6 or the values of the capacitors C1 to C8. However, if a high priority is put on the miniaturization of the demultiplexer 1, in some cases it is difficult to mount, on or in the laminated body 3, an inductor or a capacitor, necessary to obtain a desired attenuation pole. As a result, the frequency position of the attenuation pole in the vicinity of the pass band turns out to be located away from the pass band. Accordingly, the steepness of the attenuation characteristic of the attenuation pole is lost, and it is difficult to obtain a sufficient attenuation. Therefore, in the present preferred embodiment, by actively utilizing a stray capacitance Cs and an inductance component L, an attenuation pole is obtained that is situated nearer to a desired frequency position and a desired attenuation. Here, the pass band characteristic of the LPF 5 and the frequency position and the attenuation of the attenuation pole are illustrated by solid lines in FIG. 2A and FIG. 2B.

In addition, in a series arm connecting the common input terminal $P_{in}$ and the output terminal $P_{out2}$, the HPF 7 includes the inductor L1 shared by the LPF 5, capacitors C9 to C12, and an inductor L10, so as to cause a signal of about 87 MHz, for example, included in the input frequency-multiplexed signal to pass therethrough.

The HPF 7 further includes series resonant circuits 71 to 73 and a parallel resonant circuit 74. The series resonant circuit 71 includes an inductor L7 and a capacitor C13, connected in series, and is provided in a parallel arm connecting the ground and a portion between the capacitors C9 and C10. The series resonant circuit 72 includes an inductor L8 and a capacitor C14, connected in series, and is provided in a parallel arm connecting the ground and a portion between the capacitors C10 and C11. The series resonant circuit 73 includes an inductor L9 and a capacitor C15, connected in series, and is provided in a parallel arm connecting the ground and a portion between the capacitors C11 and C12. In addition, an inductor L11 and a capacitor C16 configure the parallel resonant circuit 74, and are provided in a parallel arm connecting the ground and a portion between the inductor L10 and the output terminal $P_{out2}$. Here, while described in detail later, the inductor L10 and the capacitor C16 configure a phase adjustment circuit used to significantly reduce or prevent deterioration of a high-frequency characteristic.

Figure 2A:
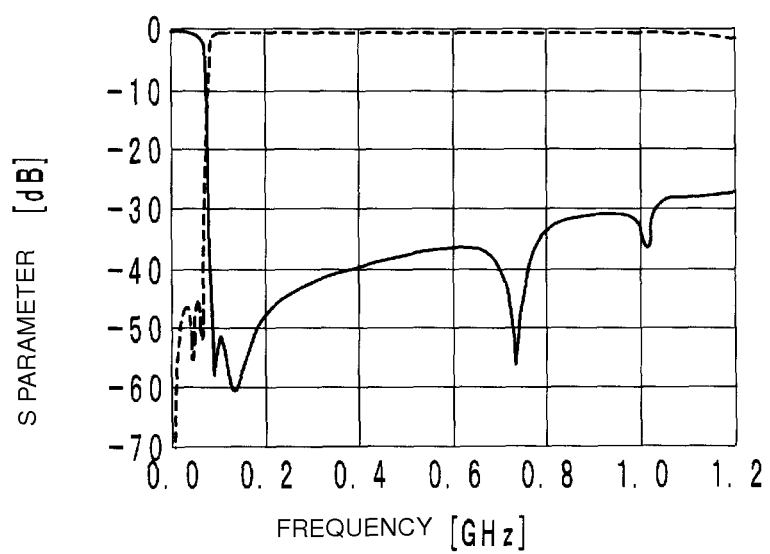
FIG. 2A is a diagram illustrating pass band characteristics or the like of an LPF and an HPF in FIG. 1.
Figure 2B:
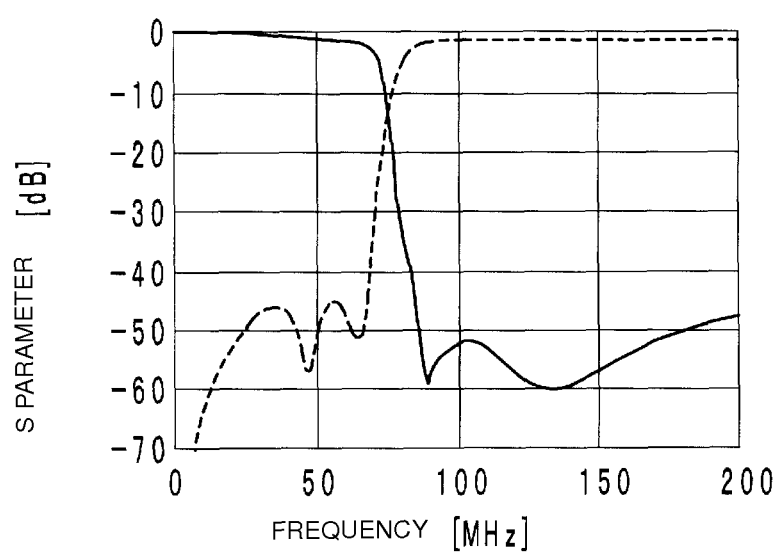
FIG. 2B is a graph illustrating pass band characteristics or the like of an LPF and an HPF, which range to about 200 MHz, for example, in FIG. 2A.
Figure 3A:
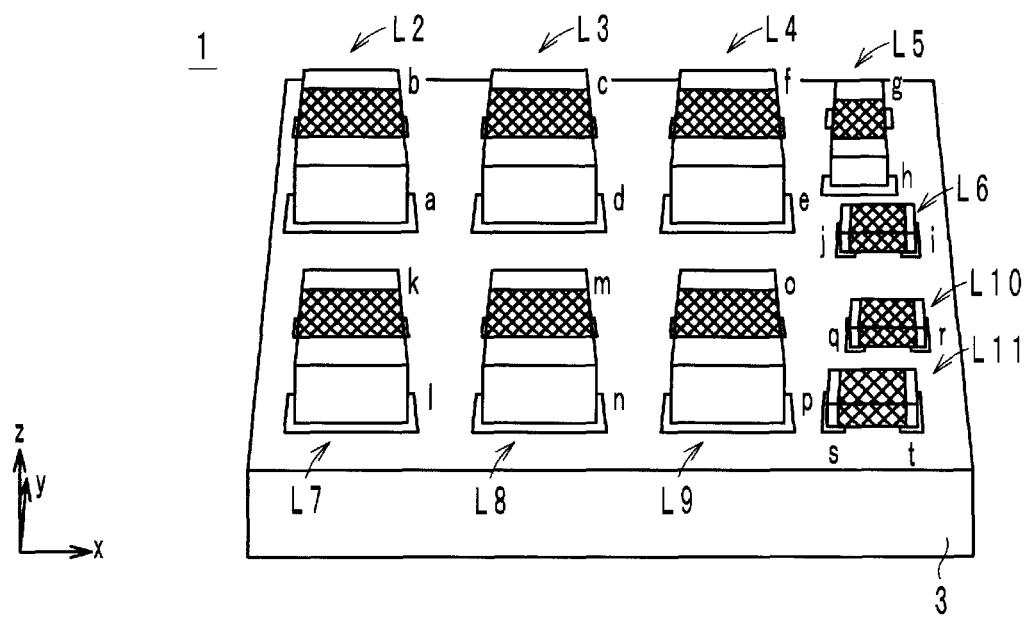
FIG. 3A is a perspective view of the demultiplexer.
Figure 3B:
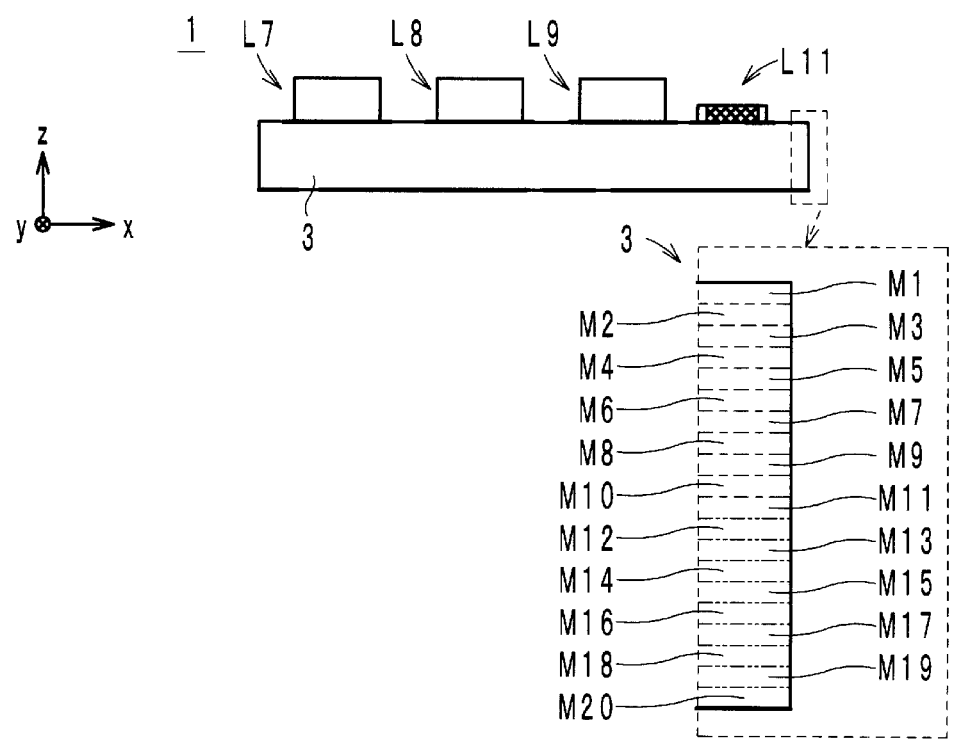
FIG. 3B is a front view of the demultiplexer in FIG. 3A.

The pass band characteristic or the like of the HPF 7 is basically defined by the values of the inductors L7 to L11 or the values of the capacitors C9 to C16, as illustrated by dotted lines in FIG. 2A and FIG. 2B.

From between the output terminal $P_{out1}$ and the ground terminal $P_{GND1}$, a signal of, for example, about 65 MHz band is output, and from between the output terminal $P_{out2}$ and the ground terminal $P_{GND3}$, a signal of, for example, about 87 MHz band is output.

As exemplified in FIG. 3A to FIG. 4D, in the laminated body 3, the demultiplexer 1 expressed by the above-mentioned equivalent circuit includes the common input terminal $P_{in}$, the LPF 5, the HPF 7, the output terminal $P_{out1}$, the output terminal $P_{out2}$, and the ground terminals $P_{GND1}$ to $P_{GND4}$.

Here, x-axes, y-axes, and z-axes, illustrated in FIG. 3A to FIG. 4D, will be described. The x-axis, the y-axis, and the z-axis are perpendicular to one another. In the present preferred embodiment, it is assumed that the x-axis indicates the lateral direction (in other words, a horizontal direction) of the demultiplexer 1. In addition, it is assumed that the y-axis indicates the depth direction (in other words, a front-back direction) of the demultiplexer 1. It is assumed that the z-axis indicates the height direction (in other words, a vertical direction) of the demultiplexer 1. The z-axis further indicates the lamination direction of a base material layer M.

A plurality of base material layers are laminated in a z-axis direction, and hence, the laminated body 3 is provided. In the present preferred embodiment, as exemplified in FIG. 3B and FIG. 4A to FIG. 4D, a first base material layer M1 to a twentieth base material layer M20 are laminated from top down in this order, and hence, the laminated body 3 is provided. Here, in the following description, in some cases, each of the base material layers M1 to M20 is collectively described as a base material layer M. Each base material layer M includes ceramics such as, for example, low temperature co-fired ceramics (LTCC). In addition to this, each base material layer M may also include a resin.

The individual base material layers M preferably have rectangular or substantially rectangular shapes that are equal or approximately equal to one another in planar view from the z-axis direction. In addition, the base material layer M1 serving as an uppermost layer preferably has a thickness of about 25 μm in the vertical direction, the base material layer M2 located immediately below preferably has a thickness of about 100 μm, the base material layers M3 to M10 preferably have thicknesses of about 300 μm, the base material layers M11 to M19 preferably have thicknesses of about 200 μm, and the base material layer M20 serving as a lowermost layer preferably has a thickness of about 200 μm, for example.

Figure 4A:
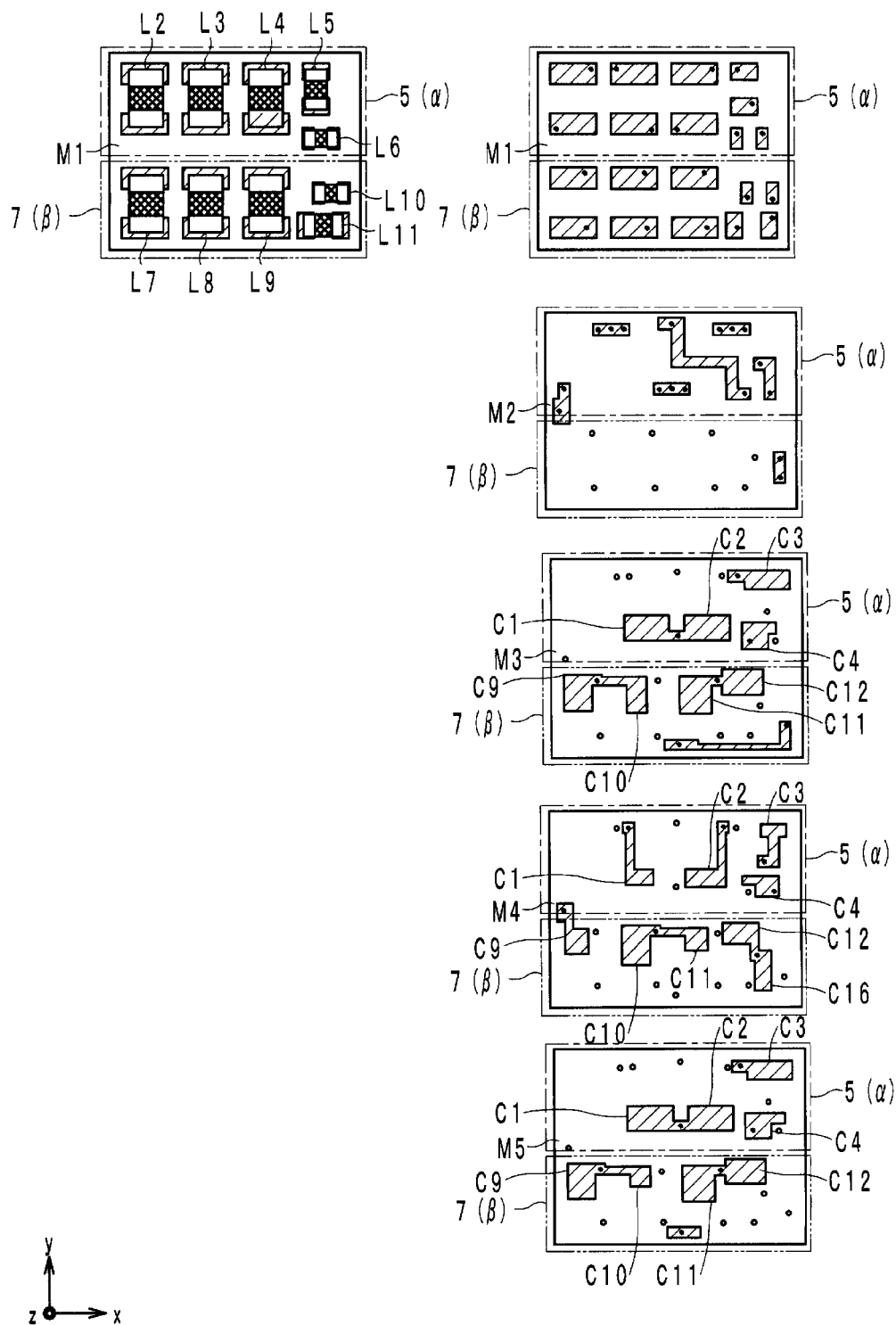
FIG. 4A illustrates top views of base material layers illustrated in FIG. 3B.
Figure 4B:
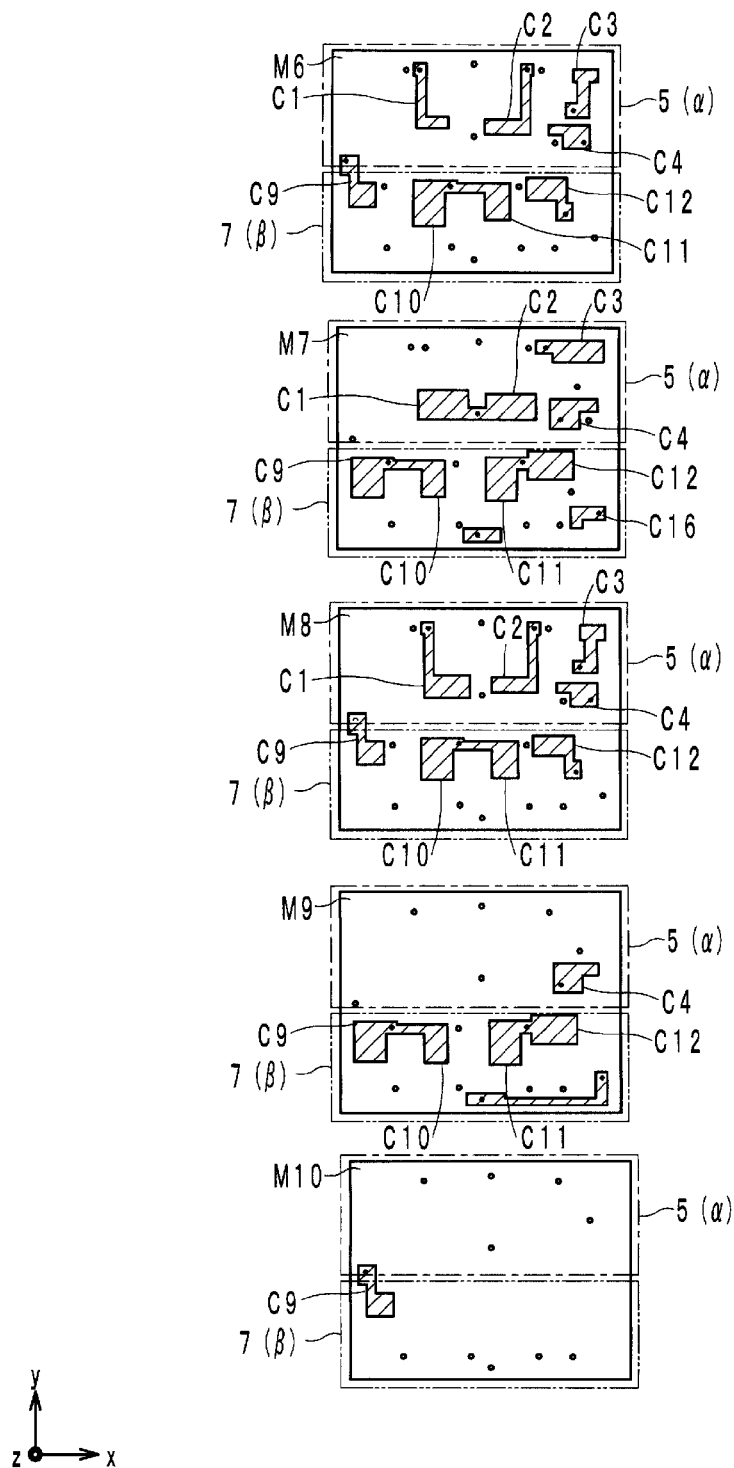
FIG. 4B illustrates top views of base material layers illustrated in FIG. 3B.
Figure 4C:
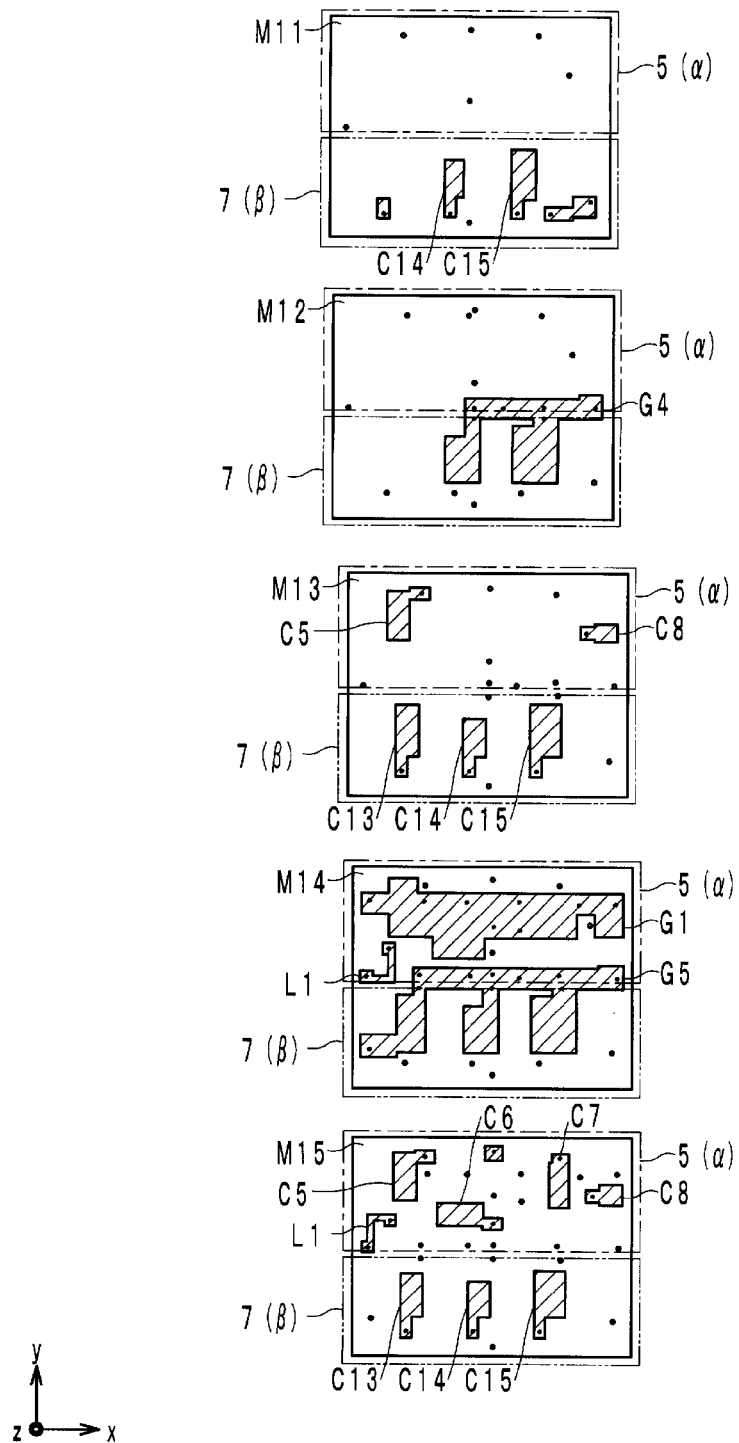
FIG. 4C illustrates top views of base material layers illustrated in FIG. 3B.
Figure 4D:
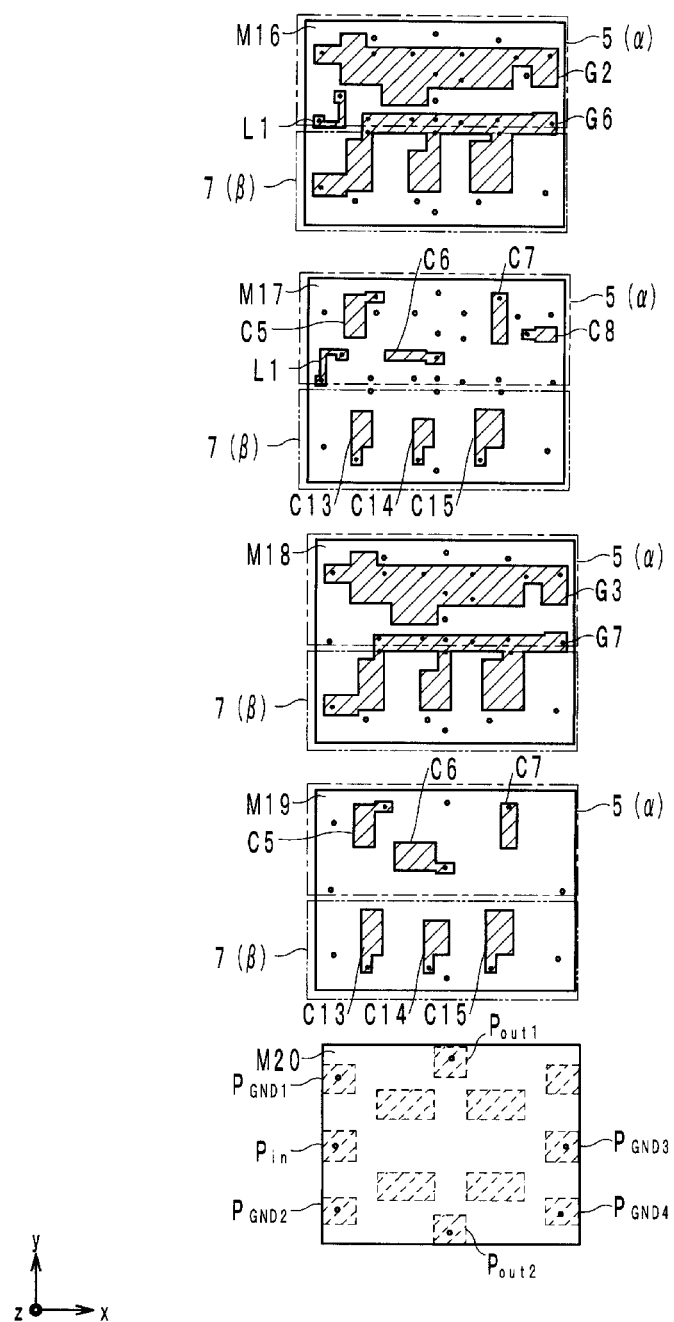
FIG. 4D illustrates top views of base material layers illustrated in FIG. 3B.

Here, in the uppermost stage of FIG. 4A, the top view of the base material layer M1 is illustrated. As illustrated on the left side of the uppermost stage of FIG. 4A, the inductors L2 to L11 are mounted on a main surface (hereinafter, in some cases, referred to as a first main surface) on the positive direction side of the z-axis of the base material layer M1. Here, the demultiplexer 1 demultiplexes a signal in a frequency band in the vicinity of about 100 MHz, for example, and hence, an inductor is necessary that has the inductance of, for example, about several hundred nH. From that point of view, it is desirable that the inductors L2 to L11 are chip inductors (for example, winding-type chip inductors) that have relatively large inductances and whose Q characteristics are good.

As illustrated on the right side of the uppermost stage of FIG. 4A, in order to mount the inductors L2 to L11, a pair of land electrodes are provided on the first main surface of the base material layer M1. Each land electrode preferably includes, for example, a conductive material such as copper. Here, in FIG. 4A to FIG. 4D, a virtual frame α is indicated by a dashed-dotted line, on the positive direction side of the y-axis on each base material layer M, and a virtual frame β is indicated by a two-dot chain line, on the negative direction side of the y-axis of each base material layer M. In planar view from the z-axis direction, the configuration of the LPF 5 is provided in the virtual frame α, and the configuration of the HPF 7 is provided in the virtual frame β.

In addition, as illustrated in the second top stage of FIG. 4A, on the top surface of the base material layer M2, a number of wiring electrodes are arranged to connect the inductors L2 to L11 to the inductor L1 and the capacitors C1 to C16 or the like, provided within the laminated body 3.

Next, the detailed configuration of the LPF 5 will be described. In the laminated body 3, first the common input terminal $P_{in}$ is located on a main surface (hereinafter, in some cases, referred to as a second main surface) on the negative direction side of the z-axis of the base material layer M20. More specifically, on this second main surface, the common input terminal $P_{in}$ is provided at an end portion on the negative direction side of the x-axis and roughly in the center in a y-axis direction.

The common input terminal $P_{in}$ is connected to one end portion of the inductor L1 through via conductors penetrating the base material layers M18 to M20. In addition, via conductors are illustrated by "•" (point) in FIG. 4A to FIG. 4D. It is desirable that each via conductor includes, for example, a metal such as copper.

In addition, each via conductor penetrates each base material layer M in the z-axis direction, and electrically connects a plurality of electrodes located on different base material layers M. In addition, as for FIG. 4A to FIG. 4D, from the point of view of viewability, no reference symbol is assigned to each via conductor.

The inductor L1 includes pattern conductors formed one by one on the top surfaces of the base material layers M14 to M17, and via conductors connecting the pattern conductors in series. As a result of this configuration, a helical coil is defined so as to circle around an axis parallel or approximately parallel to the z-axis and has a spiral or substantially spiral shape extending in the positive direction of the z-axis. The other end portion of the inductor L1 is connected to the external terminal electrode a of the inductor L2 through a via conductor and so forth. In addition, the other end portion of the inductor L1 is further electrically connected to the capacitor C9 (described later).

In addition, the external terminal electrode b of the inductor L2 is connected to the capacitor C5 through a via conductor and so forth. Here, the capacitor C5 includes pattern conductors formed one by one on main surfaces on the positive direction side of the z-axis of the base material layers M13, M15, M17, and M19, and a plurality of via conductors. The pattern conductors on the base material layers M13, M15, M17, and M19 face one or two of the ground conductors G1 to G3 in the z-axis direction. In addition, the four pattern conductors are connected in series in the z-axis direction by via conductors penetrating the individual base material layers M13 to M18. The capacitor C5 has such a configuration as described above.

The external terminal electrode c of the inductor L3 is connected to the external terminal electrode b of the inductor L2 through a via conductor and so forth. In addition, the capacitor C1 is provided within the laminated body 3 so as to be connected in parallel to the inductor L3 through a via conductor and so forth. In the present preferred embodiment, the capacitor C1 includes pattern conductors formed one by one on the top surfaces of the individual base material layers M3 to M8, and a plurality of via conductors. More specifically, two pattern conductors provided on two base material layers (for example, the base material layers M3 and M4) adjacent to each other in the z-axis direction, from among the base material layers M3 to M8, face each other in the z-axis direction, in a state in which one base material layer lies therebetween. In addition, the pattern conductors provided on the base material layers M3, M5, and M7 are connected by via conductors individually provided in the base material layers M3 to M7. In addition, the pattern conductors provided on the base material layers M4, M6, and M8 are connected by via conductors formed in the base material layers M4 to M8. The capacitor C1 has such a configuration as described above.

In addition, the external terminal electrode d of the inductor L3 is connected to one end portion of the capacitor C6 through a via conductor and so forth. Here, the capacitor C6 includes pattern conductors formed one by one on the base material layers M15, M17, and M19, and a plurality of via conductors. Specifically, the capacitor C6 includes pattern conductors formed one by one on main surfaces on the positive direction side of the z-axis of the base material layers M15, M17, and M19. The pattern conductors located on the base material layers M15, M17, and M19 face one or two of the ground conductors G1 to G3 in the z-axis direction. In addition, these three pattern conductors are connected in series in the z-axis direction by via conductors penetrating the individual base material layers M15 to M18. The capacitor C6 has such a configuration as described above.

In addition, the external terminal electrode e of the inductor L4 is connected to the external terminal electrode d of the inductor L3 through a via conductor and so forth. In addition, the capacitor C2 is arranged within the laminated body 3 so as to be connected in parallel to the inductor L4 through a via conductor and so forth. In the present preferred embodiment, the capacitor C2 includes pattern conductors formed one by one on the top surfaces of the individual base material layers M3 to M8, and a plurality of via conductors. More specifically, pattern conductors on two base material layers adjacent to each other in the z-axis direction, from among the base material layers M3 to M8, face each other in the z-axis direction through one base material layer. In addition, the pattern conductors on the base material layers M3, M5, and M7 are connected by individual via conductors formed in the base material layers M3 to M7. In addition, pattern conductors on the base material layers M4, M6, and M8 are connected by individual via conductors formed in the base material layers M4 to M8. The capacitor C2 has such a configuration as described above.

In addition, the external terminal electrode f of the inductor L4 is connected to one end portion of the capacitor C7 through a plurality of via conductors and so forth. Here, the capacitor C7 includes pattern conductors formed one by one on the base material layers M15, M17, and M19, and a plurality of via conductors. Specifically, the capacitor C7 includes pattern conductors formed one by one on main surfaces on the positive direction side of the z-axis in the base material layers M15, M17, and M19. The pattern conductors on the base material layers M15, M17, and M19 face one or two of the ground conductors G1 to G3 in the z-axis direction. In addition, these three pattern conductors are connected in series in the z-axis direction by via conductors penetrating the individual base material layers M15 to M18. The capacitor C7 has such a configuration as described above.

In addition, the external terminal electrode g of the inductor L5 is connected to the external terminal electrode f of the inductor L4 through a via conductor and so forth. In addition, the capacitor C3 is arranged within the laminated body 3 so as to be connected in parallel to the inductor L5 using a via conductor and so forth. In the present preferred embodiment, the capacitor C3 includes pattern conductors formed one by one on the top surfaces of the individual base material layers M3 to M8, and a plurality of via conductors. More specifically, two pattern conductors formed on two base material layers (for example, the base material layers M3 and M4) adjacent to each other in the z-axis direction, from among these base material layers M3 to M8, face each other in the z-axis direction, in a state in which one base material layer lies therebetween. In addition, the pattern conductors located on the base material layers M3, M5, and M7 are connected by via conductors individually formed in the base material layers M3 to M7. In addition, the pattern conductors located on the base material layers M4, M6, and M8 are connected by via conductors formed in the base material layers M4 to M8. The capacitor C3 has such a configuration as described above.

In addition, an external terminal electrode h on a front side, included in the inductor L3, is connected to one end portion of the capacitor C8 through a plurality of via conductors and so forth. Here, the capacitor C8 includes pattern conductors formed one by one on the base material layers M13, M15, and M17, and a plurality of via conductors. Specifically, the capacitor C8 includes pattern conductors formed one by one on main surfaces on the positive direction side of the z-axis of the base material layers M13, M15, and M17. The pattern conductors on the base material layers M13, M15, and M17 face one or two of the ground conductors G1 to G3 in the z-axis direction. In addition, these three pattern conductors are connected in series in the z-axis direction by via conductors penetrating the individual base material layers M13 to M16. The capacitor C8 has such a configuration as described above.

In addition, the external terminal electrode h of the inductor L5 is connected to the external terminal electrode i of the inductor L6 through a via conductor and so forth. In addition, the capacitor C4 is arranged within the laminated body 3 so as to be connected in parallel to the inductor L6 by a via conductor and so forth. More specifically, in the laminated body 3, the capacitor C4 is located in an end portion on the positive direction side of the x-axis. In the present preferred embodiment, the capacitor C4 includes pattern conductors formed one by one on the top surfaces of the individual base material layers M3 to M9, and a plurality of via conductors. More specifically, two pattern conductors located on base material layers adjacent to each other in the z-axis direction, from among these base material layers M3 to M9, face each other in the z-axis direction through a base material layer. In addition, the pattern conductors located on the base material layers M3, M5, M7, and M9 are connected by via conductors individually formed in the base material layers M3 to M8. In addition, the pattern conductors located on the base material layers M4, M6, and M8 are connected by via conductors formed in the base material layers M4 to M7. The capacitor C4 has such a configuration as described above.

The output terminal $P_{out1}$ is an electrode located on the second main surface of the base material layer M20. More specifically, on this second main surface, the output terminal $P_{out1}$ is arranged in an end portion on the positive direction side of the y-axis and roughly in the center in an x-axis direction. This output terminal $P_{out1}$ is connected to the external terminal electrode j of the inductor L6 through a plurality of via conductors.

In addition, on the second main surface of the base material layer M20, the two ground terminals $P_{GND3}$ and $P_{GND4}$ are arranged in an end portion on the positive direction side of the x-axis. In an end portion on the negative direction side of the x-axis on this second main surface, the two ground terminals $P_{GND1}$ and $P_{GND2}$ are arranged parallel or approximately parallel to the y-axis so as to sandwich therebetween the common input terminal $P_{in}$.

As described above, in the laminated body 3, on the top surfaces of the base material layers M14, M16, and M18, the ground conductors G1, G2, and G3 are located. The ground conductor G1 is provided alone so as to extend in the x-axis direction and face, in the z-axis direction, the pattern conductors of the capacitors C5 to C8, located on one of the base material layers M13 and M15. In addition, in the same way as the ground conductor G1, the ground conductors G2 and G3 are also arranged so as to extend in the x-axis direction and face, in the z-axis direction, the pattern conductors of the capacitors C5 to C8, located on the base material layers M adjacent to each other in the z-axis direction.

In addition to the above description, the ground conductor G1 faces, in the z-axis direction, pattern conductors configuring the capacitors C1 to C3 with the base material layers M8 to M13 (in other words, six layers) sandwiched therebetween. The ground conductor G1 further faces, in the z-axis direction, pattern conductors configuring the capacitor C4 with the base material layers M9 to M13 (five layers) sandwiched therebetween. As a result of this configuration, as illustrated in FIG. 1, the stray capacitances Csa to Csd occur between the capacitors C1 to C4 and the ground conductor G1.

In addition, the ground conductors G1 to G3 are connected in series in the z-axis direction through a plurality of via conductors. In addition, through a via conductor provided in an end portion on the negative direction side of the x-axis, the ground conductor G3 is connected to the ground terminal $P_{GND1}$ provided in an end portion on the negative direction side of the x-axis, in the second main surface of the laminated body 3. In addition, as described above, the stray capacitances Csa to Csd occur between pattern conductors configuring the capacitors C1 to C4 provided in the laminated body 3 and the ground conductor G1, respectively. The magnitudes of the stray capacitances Csa to Csd are individually different depending on the shapes of the pattern conductors.

Incidentally, in general, a conductor through which a current flows has inductance. Accordingly, as a whole, the ground conductors G1 to G3 have an inductance component L defined by the shapes thereof or the lengths of the current paths thereof. Here, in the equivalent circuit in FIG. 1, as La, an inductance component is illustrated that leads from the stray capacitance Csa to the ground terminal through the ground conductors G1 to G3 and via conductors. In the same way, as Lb to Ld, inductance components are illustrated as extending from the stray capacitance Csb to Csd to the ground terminal, respectively, through the ground conductors G1 to G3 and via conductors.

Here, in the present preferred embodiment, the ground conductors G1 to G3 are connected to one another through a plurality of via conductors, and the end portion of the ground conductor G3 on the negative direction side of the x-axis is connected to the ground terminal $P_{GND1}$. As a result, in the ground conductors G1 to G3, an inductance component L occurs. Here, if the inductance component L is, for example, reduced, the end portion of the ground conductor G3 on the negative direction side of the x-axis is not connected to the ground terminal but it is only necessary to connect a position, shifted to the positive direction side of the x-axis, to the ground terminal through a via conductor. In this way, in accordance with the desired inductance component L, an extraction position in the ground conductors G1 to G3, used to extract a via conductor to the ground terminal $P_{GND1}$, may be arbitrarily adjusted.

Next, the detailed configuration of the HPF 7 will be described. One end portion of the capacitor C9 is connected to the other end portion of the inductor L1 shared by the LPF 5 and the HPF 7. In the present preferred embodiment, the capacitor C9 includes pattern conductors formed one by one on the top surfaces of the individual base material layers M3 to M10, and a plurality of via conductors. The external terminal electrode k of the inductor L7 is connected to the other end portion of the capacitor C9 through a via conductor and so forth.

The external terminal electrode l of the inductor L7 is connected in series to the capacitor C13 through a via conductor and so forth. The series resonant circuit 71 is configured by the inductor L7 and the capacitor C13. The capacitor C13 includes pattern conductor groups formed one by one on the base material layers M13, M15, M17, and M19. Each pattern conductor faces, in the z-axis direction, one of the ground conductors G1, G2, and G3 provided on the base material layers M14, M16, and M18. In addition, four pattern conductors are connected in series by a plurality of via conductors. Thus, the capacitor C13 is provided.

The capacitor C10 is connected to the other end portion of the capacitor C9 by one end portion of the capacitor C10 itself. In the present preferred embodiment, the capacitor C10 includes pattern conductors formed one by one on the top surfaces of the individual base material layers M3 to M9, and a plurality of via conductors. The external terminal electrode m of the inductor L8 is connected to the other end portion of the capacitor C10 through a via conductor and so forth.

The external terminal electrode n of the inductor L8 is connected in series to the capacitor C14 through a via conductor and so forth. The series resonant circuit 72 is configured by the inductor L8 and the capacitor C14. The capacitor C14 includes pattern conductors formed one by one on the base material layers M11, M13, M15, M17, and M19. The individual pattern conductors face, in the z-axis direction, ground conductors G4, G5, G6, and G7 individually formed on the base material layers M12, M14, M16, and M18. In addition, the five pattern conductors are connected in series by a plurality of via conductors. Thus, the capacitor C14 is provided.

The capacitor C11 is connected to the other end portion of the capacitor C10 by one end portion of the capacitor C11 itself. In the present preferred embodiment, the capacitor C11 includes pattern conductors formed one by one on the top surfaces of the individual base material layers M3 to M9, and a plurality of via conductors. The external terminal electrode o of the inductor L9 is connected to the other end portion of the capacitor C11 through a via conductor and so forth.

The external terminal electrode p of the inductor L9 is connected in series to the capacitor C15 through a via conductor and so forth. The series resonant circuit 73 is configured by the inductor L9 and the capacitor C15. The capacitor C15 includes pattern conductors formed one by one on the base material layers M11, M13, M15, M17, and M19. The individual pattern conductors face, in the z-axis direction, the ground conductors G4, G5, G6, and G7 individually formed on the base material layers M12, M14, M16, and M18. In addition, the five pattern conductors are connected in series by a plurality of via conductors. Thus, the capacitor C15 is provided.

The capacitor C12 is connected to the other end portion of the capacitor C11 by one end portion of the capacitor C12 itself. In the present preferred embodiment, the capacitor C12 includes pattern conductors formed one by one on the top surfaces of the individual base material layers M3 to M9, and a plurality of via conductors. The external terminal electrode o of the inductor L9 is connected to the other end portion of the capacitor C12 through a wiring conductor, a land electrode, and a plurality of via conductors.

The external terminal electrode q of the inductor L10 is connected to the other end portion of the capacitor C12 through a via conductor and so forth. An external terminal electrode r on the right side of the inductor L10 is connected to the external terminal electrode t of the inductor L11 through a via conductor and so forth. The external terminal electrode s of the inductor L11 is connected to the ground terminal $P_{GND4}$ through a plurality of via conductors. The capacitor C16 is arranged within the laminated body 3 so as to be connected in parallel to the inductor L11. In the present preferred embodiment, the capacitor C16 includes pattern conductors on the top surfaces of the base material layers M4 and M7, and a plurality of via conductors. The other end portion of the capacitor C16 is connected to the ground terminal $P_{GND4}$ through a plurality of via conductors.

The output terminal $P_{out2}$ is an electrode provided on the bottom surface of the base material layer M20. More specifically, on this bottom surface, the output terminal $P_{out2}$ is arranged in an end portion on the negative direction side of the y-axis and roughly in the center in the x-axis direction. This output terminal $P_{out2}$ is connected to the external terminal electrode r of the inductor L10 through a via conductor and so forth.

Next, a non-limiting example of a manufacturing method for the above-mentioned demultiplexer 1 will be described. First, the laminated body 3 is manufactured. In more detail, $Al_2O_3$, $CeO_3$, $Ba_2Ti_4O_{12}$, and a Ca—Al—B—Si based glass powder are input to a ball mill, as raw materials, and subjected to wet blending. An obtained mixture is dried and ground, and an obtained powder is calcined. After having been subjected to wet grinding using a ball mill, an obtained calcined powder is dried and subjected to cracking, and a ceramic powder is obtained. In addition, a dielectric material configuring the laminated body is not specifically limited, and a synthetic resin, dielectric ceramics, or the like may also be used.

A binder, a plasticizer, a wetting agent, and a dispersing agent are added to a desired ceramic powder, and mixed using a ball mill, and then defoaming is performed under reduced pressure. An obtained ceramic slurry is formed into a substantially sheet shape and dried, by a doctor blade method, and ceramic green sheets to be individual base material layers M are obtained.

Next, in each ceramic green sheet, using a laser or punching press, through-holes used for via conductors are formed, and these through-holes are filled with an electrode paste including a metal whose main component is, for example, copper or the like. A desired number of such ceramic green sheets (twenty sheets including the base material layers M1 to M20, in the present preferred embodiment) are laminated.

Next, using a method such as a screen printing method or a photolithographic method, a conductive paste whose main component is a metal such as, for example, copper is applied onto one main surface of each ceramic green sheet, and hence, various kinds of electrodes and various kinds of pattern conductors are formed.

Next, the laminated body of ceramic green sheets is collectively subjected to pressure bonding, and then, fired. After that, the inductors L2 to L11 are mounted on the top surface of the laminated body 3. After that, the laminated body of ceramic green sheets is diced into the sizes of the individual laminated bodies 3, and the demultiplexer 1 is completed.

As described above, the stray capacitances Csa to Csd occur between the capacitors C1 to C4 and the ground conductor G1, as illustrated in FIG. 1. Here, a distance between the capacitor C4 and the ground conductor G1 is smaller than distances between the capacitors C1 to C3 and the ground conductor G1. Accordingly, the stray capacitance Csd based on the capacitor C4 becomes the largest.

In addition, the capacitors C1 to C4 are arranged so as to be aligned in the x-axis direction, and individually face the ground conductor G1. In addition, the ground conductors G1 to G3 are connected to the ground terminal $P_{GND1}$ through end portions on the negative direction side of the x-axis. Accordingly, currents flow through the ground conductors G1 to G3, the currents flowing through lengths practically corresponding to the x-axis direction length of the laminated body 3. Since the currents flow through relatively long sections, the relatively large inductance component L occurs in the ground conductors G1 to G3.

Since such a large inductance component L and such a stray capacitance Cs are series-resonate, it is possible to adjust the frequency position of an attenuation pole to the vicinity of the pass band of the LPF 5, and it is possible to improve an attenuation in the attenuation pole. Here, the frequency position of the attenuation pole is adjusted by arbitrarily changing the inductance component L (in other words, the x-axis direction lengths of the ground conductors G1 to G3, or positions in the ground conductors G1 to G3, which connect to the ground terminal $P_{GND1}$).

Here, so as to confirm the technical advantageous effect of the present preferred embodiment, the inventor of the present application prepared a comparative example (hereinafter, referred to as a demultiplexer 1') illustrated in FIG. 5.

Figure 5:
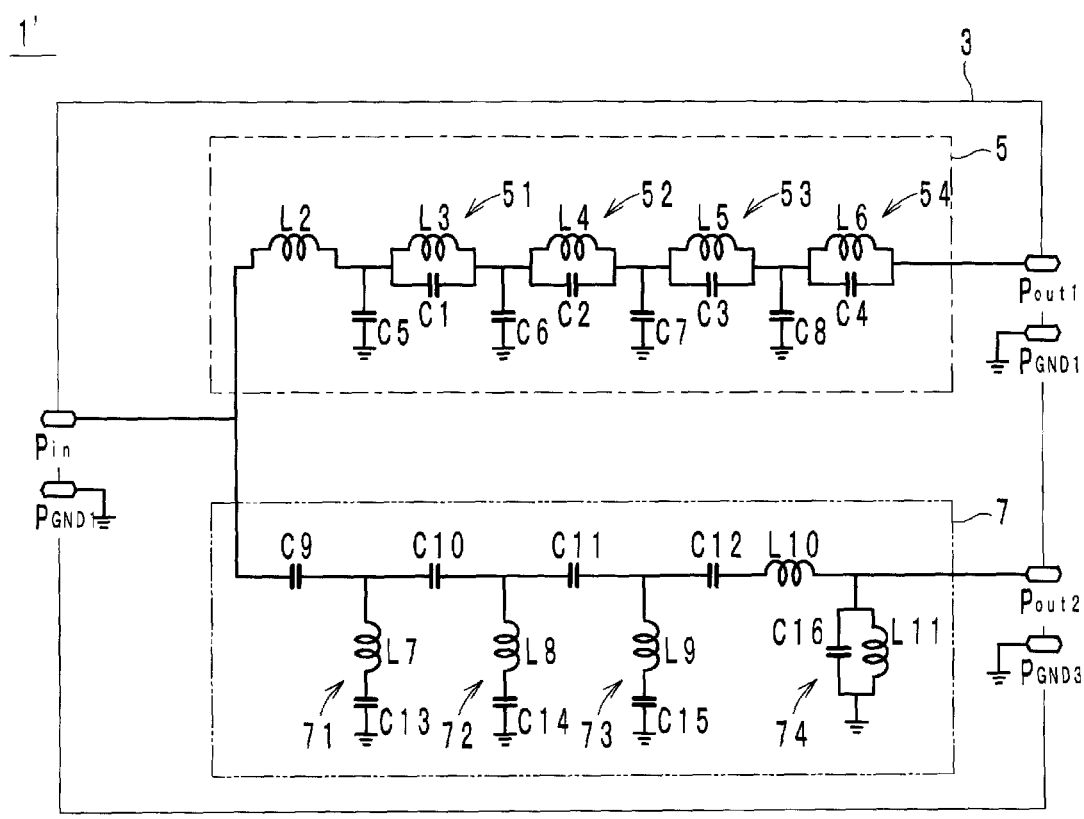
FIG. 5 is an equivalent circuit diagram of a demultiplexer according to a comparative example.
Figure 6:
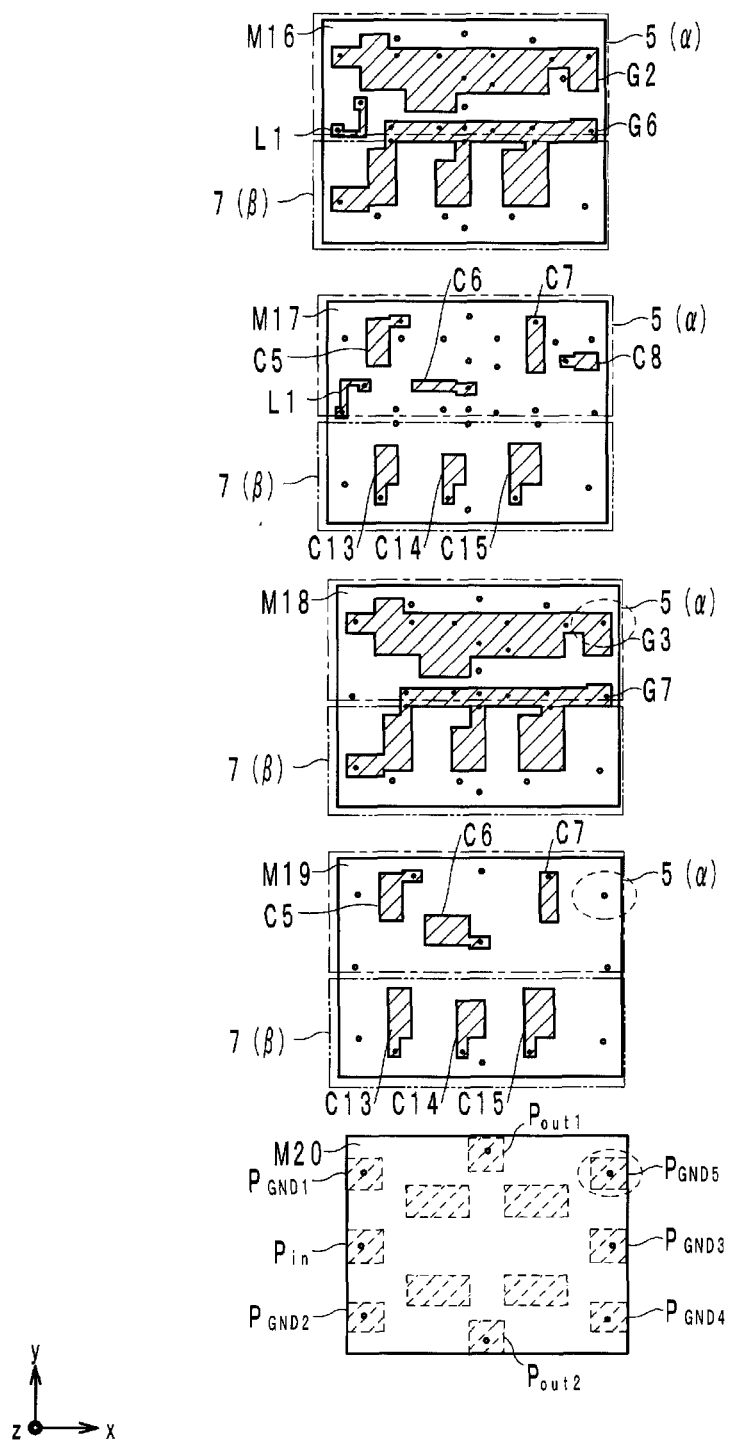
FIG. 6 illustrates top views of base material layers illustrated in FIG. 5.

Compared with the demultiplexer 1 in FIG. 1, the demultiplexer 1' in FIG. 5 is different in that a configuration not causing the inductance component L to occur is adopted. More specifically, as illustrated in portions surrounded by ellipses in FIG. 6, in the demultiplexer 1', the ground conductor G1 and so forth are connected to the ground terminal $P_{GND5}$ through end portions on the positive direction side of the x-axis. As a result, a current, which is not too large, flows through the ground conductor G1 and so forth in the x-axis direction.

In addition to this, the demultiplexer 1' is different from the demultiplexer 1 in that the demultiplexer 1' does not include the inductor L1. However, since the inductor L1 does not affect the characteristic of the attenuation pole, even if the demultiplexer 1 including the inductor L1 is compared with the demultiplexer 1' including no inductor L1, a discussion about the technical advantageous effect substantially has no problem.

In addition to the above description, there is no difference between both of the demultiplexers 1 and 1'. Therefore, in FIG. 5, the same reference symbol is assigned to a configuration corresponding to the configuration in FIG. 1, and the description thereof will be omitted.

Figure 7A:
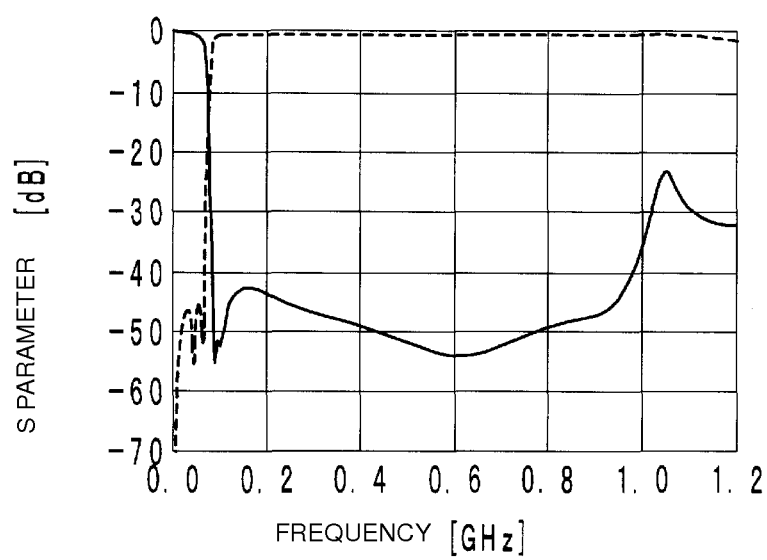
FIG. 7A is a diagram illustrating pass band characteristics or the like of an LPF and an HPF in FIG. 5.
Figure 7B:
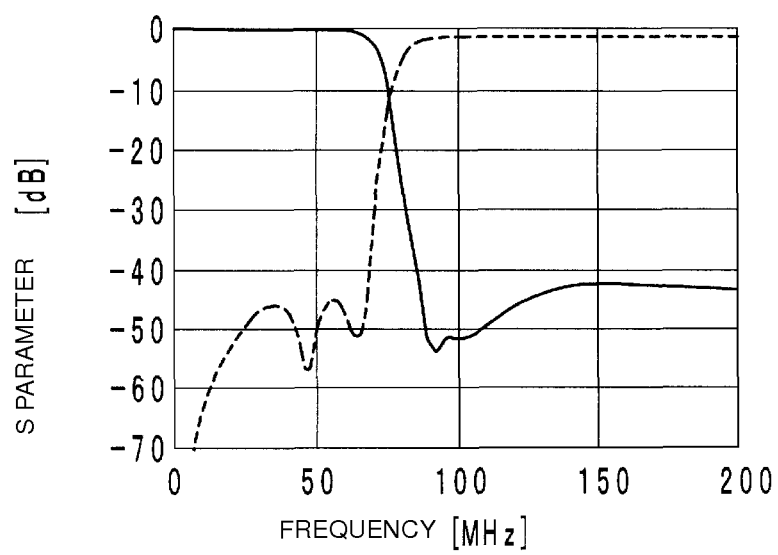
FIG. 7B is a graph illustrating pass band characteristics of an LPF and an HPF, which range to about 200 MHz, for example, in FIG. 7A.

Here, FIG. 7A illustrates the pass band characteristic of the demultiplexer 1' in FIG. 5, and FIG. 7B illustrates a pass band characteristic ranging to 200 MHz in FIG. 7A. As will be appreciated when FIG. 2B and FIG. 7B are compared with each other, in the demultiplexer 1 according to the present preferred embodiment, by utilizing series resonance due to the relatively large inductance component L and the stray capacitances Csa to Csd, the attenuation pole is shifted to a low frequency side and an attenuation in the vicinity of the pass band becomes large, compared with the demultiplexer 1' according to the comparative example. In this way, according to the present preferred embodiment, it should be understood that a more desirable attenuation pole is obtained.

The inductors L2 to L11 preferably are winding-type chip inductors, and mounted on the first main surface (in other words, the surface of the laminated body 3) of the base material layer M1. Compared with an inductor configured within the laminated body 3 using a pattern conductor, it is easy for the winding-type chip inductor to increase an L value and a Q value. Accordingly, it is possible to miniaturize the low pass filter and thus the demultiplexer, and increase the Q value. In addition, since the inductors L2 to L11 preferably are surface-mount components, the inductors L2 to L11 are easily mounted on the laminated body 3.

In addition, the inductor L1 is inserted in the series arms of the LPF 5 and the HPF 7, immediately after the common input terminal $P_{in}$. Accordingly, the impedance of each of the LPF 5 and the HPF 7 becomes large. As a result, it is possible to significantly reduce or prevent the return loss of the demultiplexer 1. In particular, it is possible to significantly reduce or prevent a return loss in the pass band of the HPF 7.

In addition, according to the demultiplexer 1, at least the capacitors C1 to C16 are provided in the laminated body 3. Accordingly, an undesired stray capacitance occurs, and deteriorates a high-frequency characteristic in some cases. Therefore, in the present preferred embodiment, a phase adjustment circuit including the inductor L10, the capacitor C16, and the inductor L11 is inserted in the subsequent stage of the HPF 7, and the deterioration of the high-frequency characteristic is significantly reduced or prevented. With this phase adjustment circuit, it is possible to adjust an output impedance with broadening the pass band of the HPF 7.

In addition, according to the above-mentioned demultiplexer 1, for example, while being provided on the same base material layer M14 (refer to FIG. 4C), the first ground conductor G1 on the LPF 5 side and the second ground conductor G5 on the HPF 7 side are isolated from each other. Here, if the LPF 5 and the HPF 7 share a ground conductor, mutual interference occurs between the LPF 5 and the HPF 7. In order to avoid such interference, the first ground conductors G1 to G3 on the LPF 5 side and the second ground conductors G4 to G7 on the HPF 7 side are isolated from each other.

In addition, as is clear from the above description and FIG. 4A to FIG. 4D, with reference to the capacitors C1 to C4, the ground conductors G1 to G3 are located near the ground terminals $P_{GND1}$ to $P_{GND4}$ provided on the second main surface of the laminated body 3. With this configuration, since it is possible to reduce distances between the ground conductors G1 to G3 and the ground terminals $P_{GND1}$ to $P_{GND4}$, it is possible to significantly reduce or prevent the occurrence of an extra inductance component.

Figure 8:
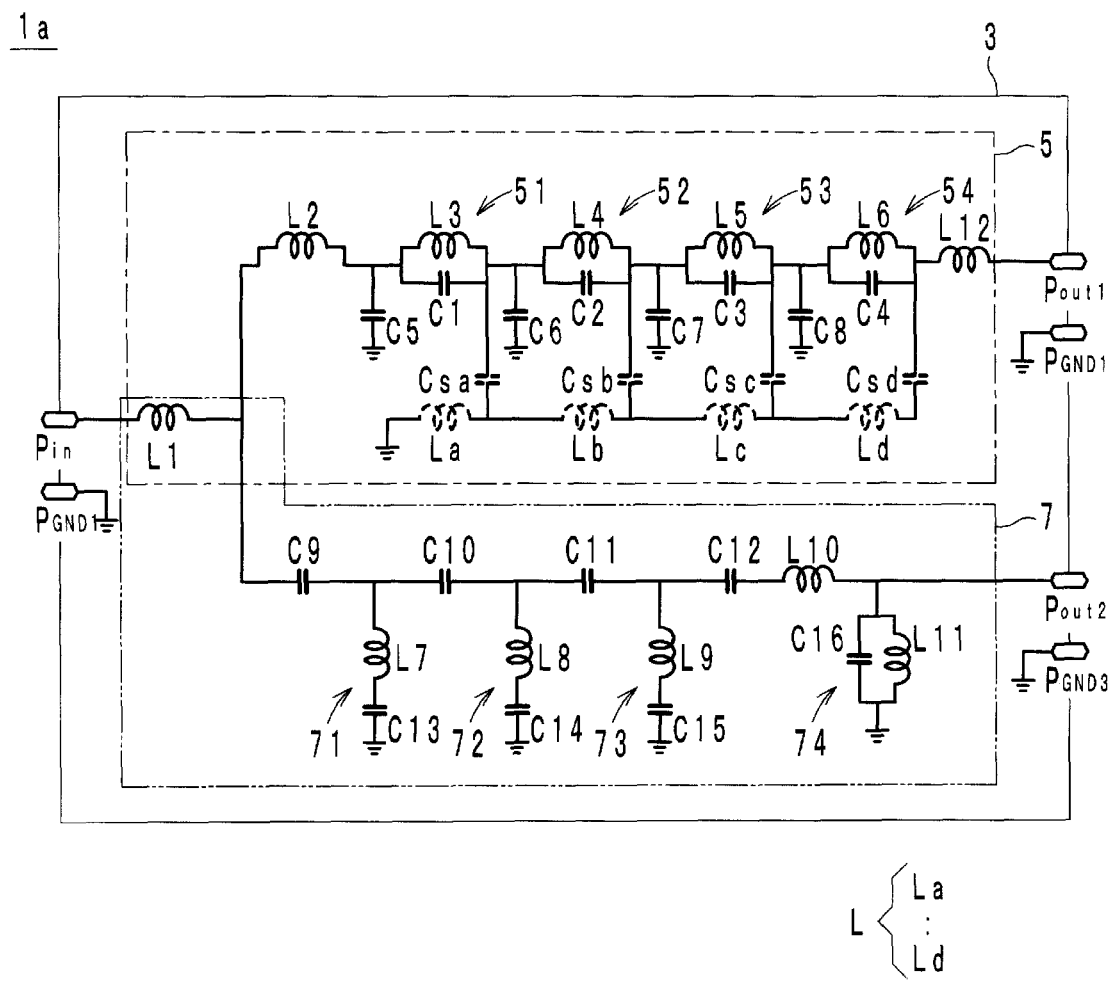
FIG. 8 is an equivalent circuit diagram of a demultiplexer according to an example of a modification of a preferred embodiment of the present invention.
Figure 9A:
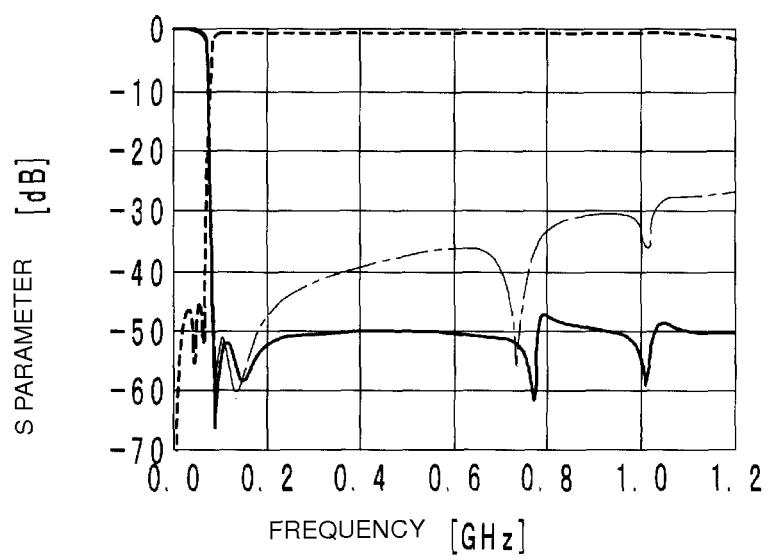
FIG. 9A is a diagram illustrating pass band characteristics or the like of an LPF and an HPF in FIG. 8.
Figure 9B:
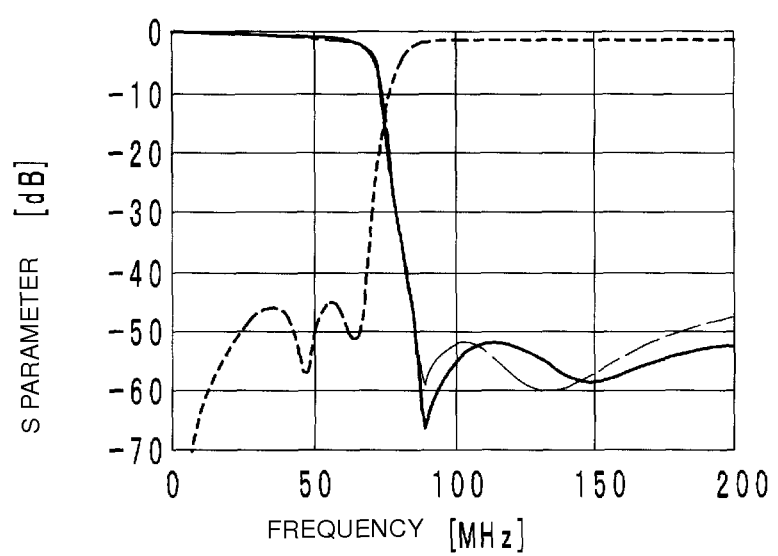
FIG. 9B is a graph illustrating pass band characteristics or the like of an LPF and an HPF, which range to about 200 MHz, for example, in FIG. 9A.

Next, with reference to FIG. 8 to FIG. 9B, a demultiplexer 1a according to an example of a modification to the above-described preferred embodiment will be described. Compared with the demultiplexer 1 in FIG. 1, the demultiplexer 1a in FIG. 8 is different in that an inductor L12 is further provided between the parallel resonant circuit 54 in the LPF 5 and the output terminal $P_{out1}$. Other than this, there is no difference between the demultiplexers 1 and 1a. Therefore, in FIG. 8, the same reference symbol is assigned to a configuration corresponding to the configuration in FIG. 1, and the description thereof will be omitted.

The inductor L12 may be a winding-type chip inductor mounted on the first main surface of the base material layer M1, and may also be embedded within the laminated body 3. This inductor L12 is provided, and hence, as illustrated in FIG. 9A and FIG. 9B, compared with the case of the above-mentioned preferred embodiment (refer to a dashed-dotted line), it is possible to improve an attenuation on a high-frequency side in the LPF 5 to a high-frequency band ranging to approximately the third harmonic of a fundamental wave.

In addition, in order to easily pick up the demultiplexers 1 and 1a, it is desirable that the inductors L2 to L11 are located so that spaces used to pick up the demultiplexers 1 and 1a are reserved at approximately central portions of the first main surfaces of the demultiplexers 1 and 1a.

In addition, a metal case and a resin cover or a top plate may also be provided on the first main surfaces of the demultiplexers 1 and 1a. In addition, while a commonly-used resin is available for the resin cover or the top plate, it is desirable that the resin cover or the top plate includes a magnetic material so as to confine a magnetic field generated by the inductors L2 to L11.

In addition, the demultiplexers 1 and 1a may also be housed in metallic cases.

In addition, in the above-mentioned preferred embodiment, an example has been described where the LPF 5 and the HPF 7 are embedded within the demultiplexer 1. However, without limitation to this, no HPF 7 may be provided, and the LPF 5 may also be provided alone. In addition, without limitation to the demultiplexer 1, this LPF 5 may also be embedded within a resonator, a filter, a balun, or the like.

In addition, in the above-mentioned preferred embodiment, an example has been described where the inductor L1 is included in the LPF 5 and the HPF 7. However, no inductor L1 may also be included in the LPF 5 and the HPF 7.

A polar-type low pass filter according to preferred embodiments of the present invention provides an attenuation pole in a desired frequency position, and is suitable for a demultiplexer, a resonator, a balun, and so forth.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A polar low pass filter comprising:
   a laminated body in which a plurality of base layers are laminated;
   an input terminal, an output terminal, and a ground terminal located on or in a surface of the laminated body; and
   at least one ground conductor located within the laminated body; wherein
   a series arm connecting the input terminal and the output terminal includes a parallel resonant circuit including a capacitor and an inductor;
   a parallel arm connecting the series arm and the ground terminal includes at least a capacitor;
   at least the capacitor included in the parallel resonant circuit includes a plurality of pattern conductors located within the laminated body;
   the at least one ground conductor and at least one of the plurality of pattern conductors face each other in a lamination direction of the plurality of base layers; and
   the polar low pass filter is defined within a first virtual frame of the laminated body and a high pass filter is defined within a second virtual frame of the laminated body adjacent to the first virtual frame.

2. The polar low pass filter according to claim 1, wherein the at least one ground conductor extends in a direction perpendicular or approximately perpendicular to the lamination direction and is connected to the ground terminal.

3. The polar low pass filter according to claim 1, further comprising an inductor located between one end portion of the parallel resonant circuit nearest to the output terminal on an equivalent circuit and the output terminal.

4. The polar low pass filter according to claim 1, wherein
   the ground terminal is provided on or in a main surface of the laminated body, perpendicular or approximately perpendicular to the lamination direction; and
   in the lamination direction, the at least one ground conductor is located nearer to the ground terminal than the plurality of pattern conductors configuring the capacitor included in the parallel resonant circuit.

5. The polar low pass filter according to claim 1, wherein the inductor included in the parallel resonant circuit is a wound chip inductor, and mounted on or in a main surface of the laminated body, perpendicular or approximately perpendicular to the lamination direction.

6. The polar low pass filter according to claim 1, wherein the input terminal, the output terminal, and the ground terminal are located on a bottom surface of the laminated body.

7. The polar low pass filter according to claim 6, wherein a plurality of chip inductors is mounted on a top surface of the laminated body.

8. The polar low pass filter according to claim 1, wherein wiring electrodes are located on a top surface of one of the base layers to electrically connect at least one of the capacitor and the inductor of the series arm and the capacitor of the parallel arm to other conductive elements located on or in the laminated body.

9. The polar low pass filter according to claim 1, wherein the laminated body including a plurality of via conductors arranged to electrically connect at least one of the capacitor and the inductor of the series arm and the capacitor of the parallel arm to other conductive elements located on or in the laminated body.

10. A demultiplexer comprising:
a laminated body in which a plurality of base layers are laminated;
an input terminal, an output terminal, and a ground terminal located on or in a surface of the laminated body;
at least one ground conductor located within the laminated body;
a high pass filter provided in the laminated body and including a capacitor and an inductor; and
a polar low pass filter provided in the laminated body; wherein
in the polar low pass filter, a series arm connecting the input terminal and the output terminal includes a parallel resonant circuit including a capacitor and an inductor, and a parallel arm connecting the series arm and the ground terminal includes at least a capacitor;
at least the capacitor included in the parallel resonant circuit includes a plurality of pattern conductors located within the laminated body;
the at least one ground conductor and at least one of the plurality of pattern conductors face each other in a lamination direction of the plurality of base layers; and
the at least one ground conductor includes:
a first ground conductor included in the low pass filter; and
a second ground conductor included in the high pass filter and isolated from the first ground conductor.

11. The demultiplexer according to claim 10, wherein the inductors included in the parallel resonant circuit and the high pass filter are wound chip inductors; and
the wound chip inductors are mounted on or in a main surface of the laminated body, perpendicular or approximately perpendicular to the lamination direction.

12. The demultiplexer according to claim 10, wherein the input terminal, the output terminal, and the ground terminal are located on a bottom surface of the laminated body.

13. The demultiplexer according to claim 12, wherein a plurality of chip inductors is mounted on a top surface of the laminated body.

14. The demultiplexer according to claim 10, wherein wiring electrodes are located on a top surface of one of the base layers to electrically connect at least one of the capacitor and the inductor of the series arm and the capacitor of the parallel arm to other conductive elements located on or in the laminated body.

15. The demultiplexer according to claim 10, wherein the laminated body including a plurality of via conductors arranged to electrically connect at least one of the capacitor and the inductor of the series arm and the capacitor of the parallel arm to other conductive elements located on or in the laminated body.

16. A demultiplexer comprising:
a laminated body in which a plurality of base layers are laminated;
an input terminal, an output terminal, and a ground terminal located on or in a surface of the laminated body;
at least one ground conductor located within the laminated body;
a high pass filter provided in the laminated body and including a capacitor and an inductor; and
a polar low pass filter provided in the laminated body; wherein
in the polar low pass filter, a series arm connecting the input terminal and the output terminal includes a parallel resonant circuit including a capacitor and an inductor, and a parallel arm connecting the series arm and the ground terminal includes at least a capacitor;
at least the capacitor included in the parallel resonant circuit includes a plurality of pattern conductors located within the laminated body;
the at least one ground conductor and at least one of the plurality of pattern conductors face each other in a lamination direction of the plurality of base layers; and
the polar low pass filter is defined within a first virtual frame of the laminated body and the high pass filter is defined within a second virtual frame of the laminated body adjacent to the first virtual frame.

* * * * *